(12) United States Patent  
Lu

(10) Patent No.: US 9,295,180 B2  
(45) Date of Patent: Mar. 22, 2016

(54) CENTRIFUGAL FAN

(75) Inventor: Chao-Wen Lu, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 808 days.

(21) Appl. No.: 13/614,081

(22) Filed: Sep. 13, 2012

(65) Prior Publication Data

US 2013/0071238 A1 Mar. 21, 2013

Related U.S. Application Data

(60) Provisional application No. 61/536,344, filed on Sep. 19, 2011.

(51) Int. Cl.
| | |
|---|---|
| F04D 29/42 | (2006.01) |
| H01L 23/467 | (2006.01) |
| H05K 7/20 | (2006.01) |
| G06F 1/20 | (2006.01) |
| H01L 23/427 | (2006.01) |

(52) U.S. Cl.
CPC ............ *H05K 7/20172* (2013.01); *G06F 1/203* (2013.01); *H01L 23/467* (2013.01); *H01L 23/427* (2013.01); *H01L 2924/0002* (2013.01)

(58) Field of Classification Search
CPC ... H05K 7/20172; G06F 1/203; H01L 23/467
See application file for complete search history.

(56) References Cited

U.S. PATENT DOCUMENTS

| | | | |
|---|---|---|---|
| 6,179,561 B1 * | 1/2001 | Horng | 415/208.3 |
| 6,421,239 B1 * | 7/2002 | Huang | 361/696 |
| 2006/0024160 A1 * | 2/2006 | Horng et al. | 415/206 |
| 2011/0017430 A1 * | 1/2011 | Lian et al. | 165/104.26 |

* cited by examiner

*Primary Examiner* — Richard Edgar
*Assistant Examiner* — Brian O Peters
(74) *Attorney, Agent, or Firm* — Muncy, Geissler, Olds & Lowe, P.C.

(57) ABSTRACT

A centrifugal fan is provided. The centrifugal fan includes an impeller and a housing. The impeller has an impeller diameter. The housing includes an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet, wherein a greatest width of the inlet is greater than or equal to the impeller diameter.

17 Claims, 5 Drawing Sheets

CENTRIFUGAL FAN

CROSS REFERENCE TO RELATED APPLICATIONS

This application claims the benefit of U.S. Provisional Application No. 61/536,344, filed Sep. 19, 2011, the entirety of which is incorporated by reference herein.

BACKGROUND OF THE INVENTION

1. Field of the Invention

The present invention relates to a fan, and in particular relates to a centrifugal fan.

2. Description of the Related Art

Portable computers (for example, tablet computers or ultrabooks) are extremely thin, and the inner space therein is limited. The dimensions of the centrifugal fan disposed in the portable computer have decreased, and the space between the centrifugal fan and other elements inside of the portable computer has reduced. The heat dissipation effect of the centrifugal fan has therefore deteriorated. Particularly, with limited inner space, the input flow rate of the centrifugal fan has decreased, and the heat dissipation effect has worsened.

BRIEF SUMMARY OF THE INVENTION

In one embodiment of the invention, a centrifugal fan is provided. The centrifugal fan includes an impeller and a housing. The impeller has an impeller diameter. The housing includes an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet, wherein a greatest width of the inlet is greater than or equal to the impeller diameter.

In one embodiment, the housing has a first peripheral structure and a second peripheral structure, wherein the first peripheral structure and the second peripheral structure surround the inlet, the first peripheral structure has a first outer surface, the second peripheral structure has a second outer surface, the first outer surface relative to the impeller has a first outer surface height corresponding to an impeller axial direction, the second outer surface relative to the impeller has a second outer surface height corresponding to the impeller axial direction, and the second outer surface height is higher than the first outer surface height.

Utilizing the centrifugal fan of the embodiment of the invention, even though the inlet of the centrifugal fan is adjacent to other electronic elements, due to the step difference between the first peripheral structure and the second peripheral structure, the major flow is impelled into the inlet. The inlet diameter is greater than or equal to the impeller diameter, so the impelled flow rate is increased, and heat dissipation effect is improved. At least a portion of the first peripheral structure is located in the high pressure area to prevent flow leakage. Since tablet computers and the ultrabooks are extremely thin, the dimensions of the centrifugal fan disposed therein need to be decreased, and the height of the blades need to be decreased. However, the working area of the blades would need to be reduced. In the embodiment of the invention, the blades are extended to the outer surface of the peripheral structure around the inlet, thus, the height of the blades is increased, and the working area and heat dissipation effect thereof are improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
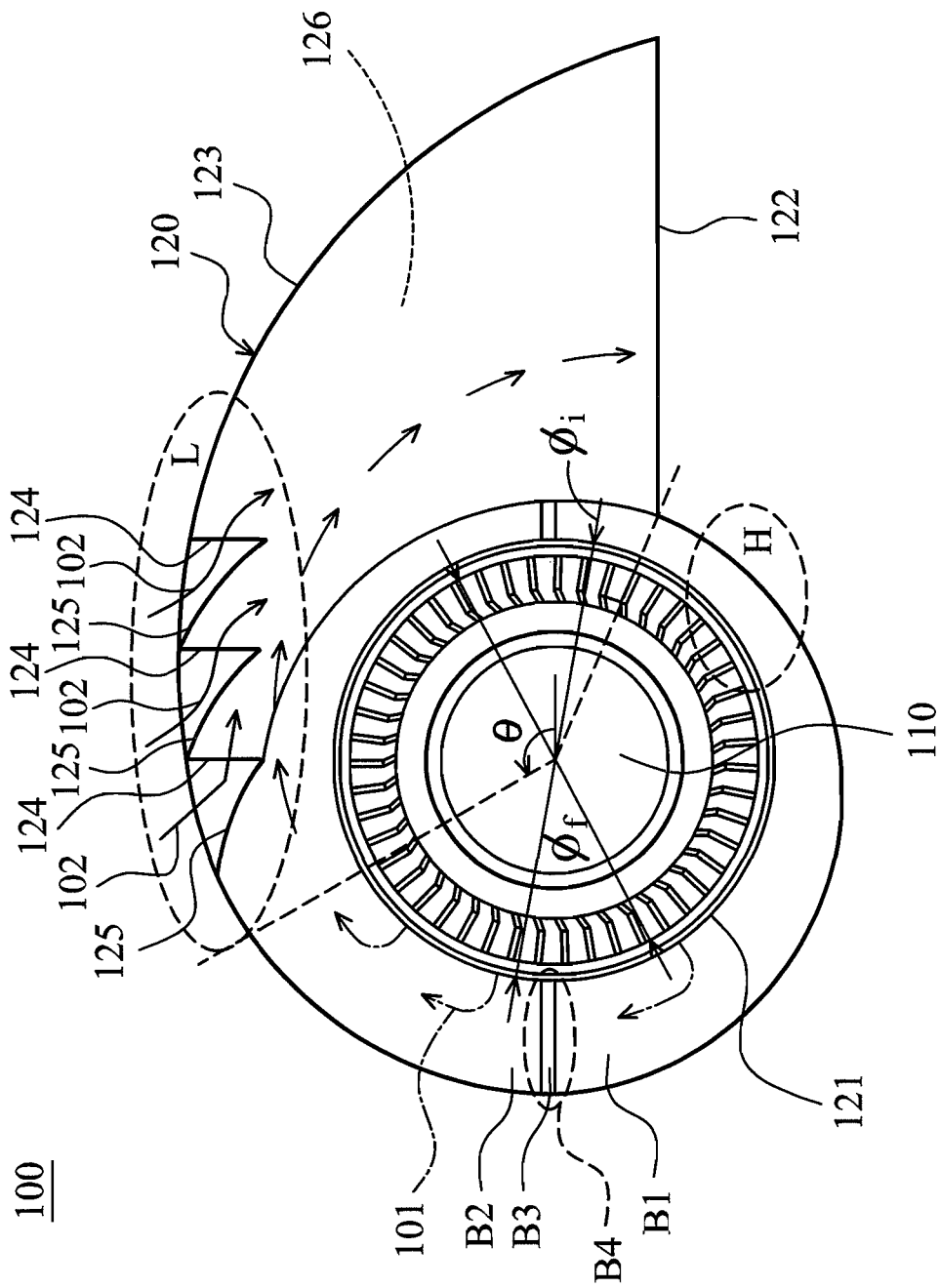
FIG. 1A is a top view of the centrifugal fan of an embodiment of the invention.
Figure 1B:
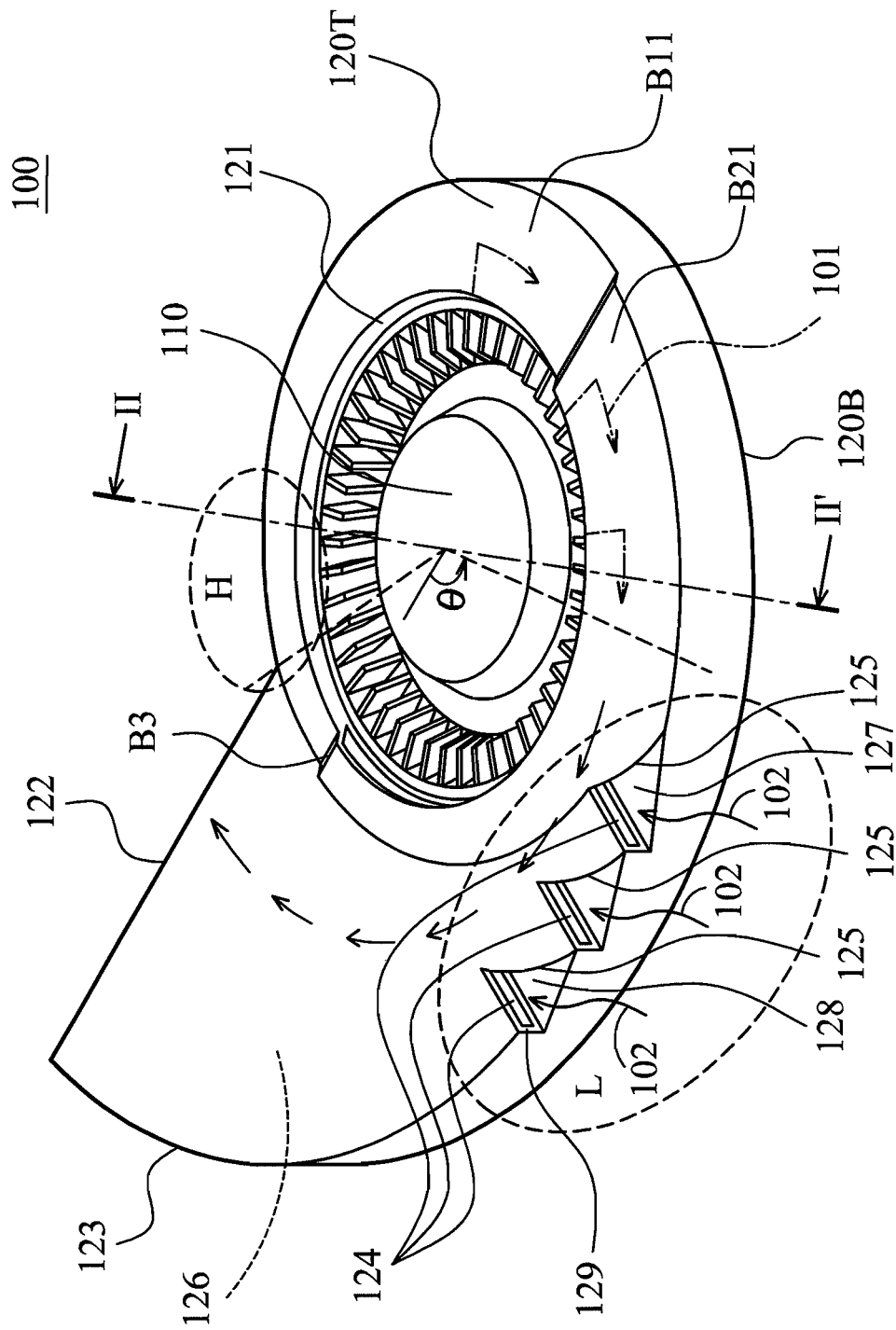
FIG. 1B is a perspective view of the centrifugal fan of an embodiment of the invention.

FIGS. 1A and 1B show a centrifugal fan 100 of an embodiment of the invention, including an impeller 110 and a housing 120. An inlet 121 and an outlet 122 are formed on the housing 120. The inlet 121 is perpendicular to the outlet 122. A flow path 126 communicates the inlet 121 to the outlet 122. The housing 120 includes an upper plate 120T, a lower plate 120B and a side wall 123. The impeller 110 is disposed in the inlet 121. At least one auxiliary inlet 124 is formed in a guiding groove 127 of the housing 120. The auxiliary inlets 124 face to the outlet 122. When the centrifugal fan 100 operates, a major flow 101 is impelled by the impeller 110, entering the housing 120 through the inlet 121, and passing through the flow path 126, and then, it is output through the outlet 122. The impeller 110 has an impeller diameter $\psi_f$. The greatest width of the inlet 121 is greater than or equal to the impeller diameter $\psi_f$. The shape of the inlet 121 is preferred to be circular, the inlet 121 has an inlet diameter $\psi_i$, the greatest width of the inlet 121 is the inlet diameter $\psi_i$, and the inlet diameter $\psi_i$ is greater than or equal to the impeller diameter $\psi_f$.

With reference to FIGS. 1A and 1B, the housing 120 has a first peripheral structure B1 and a second peripheral structure B2, and the first peripheral structure B1 and the second peripheral structure B2 surround the inlet 121. The first peripheral structure B1 has a first outer surface B11, and the second peripheral structure B2 has a second outer surface B21.

Figure 2:
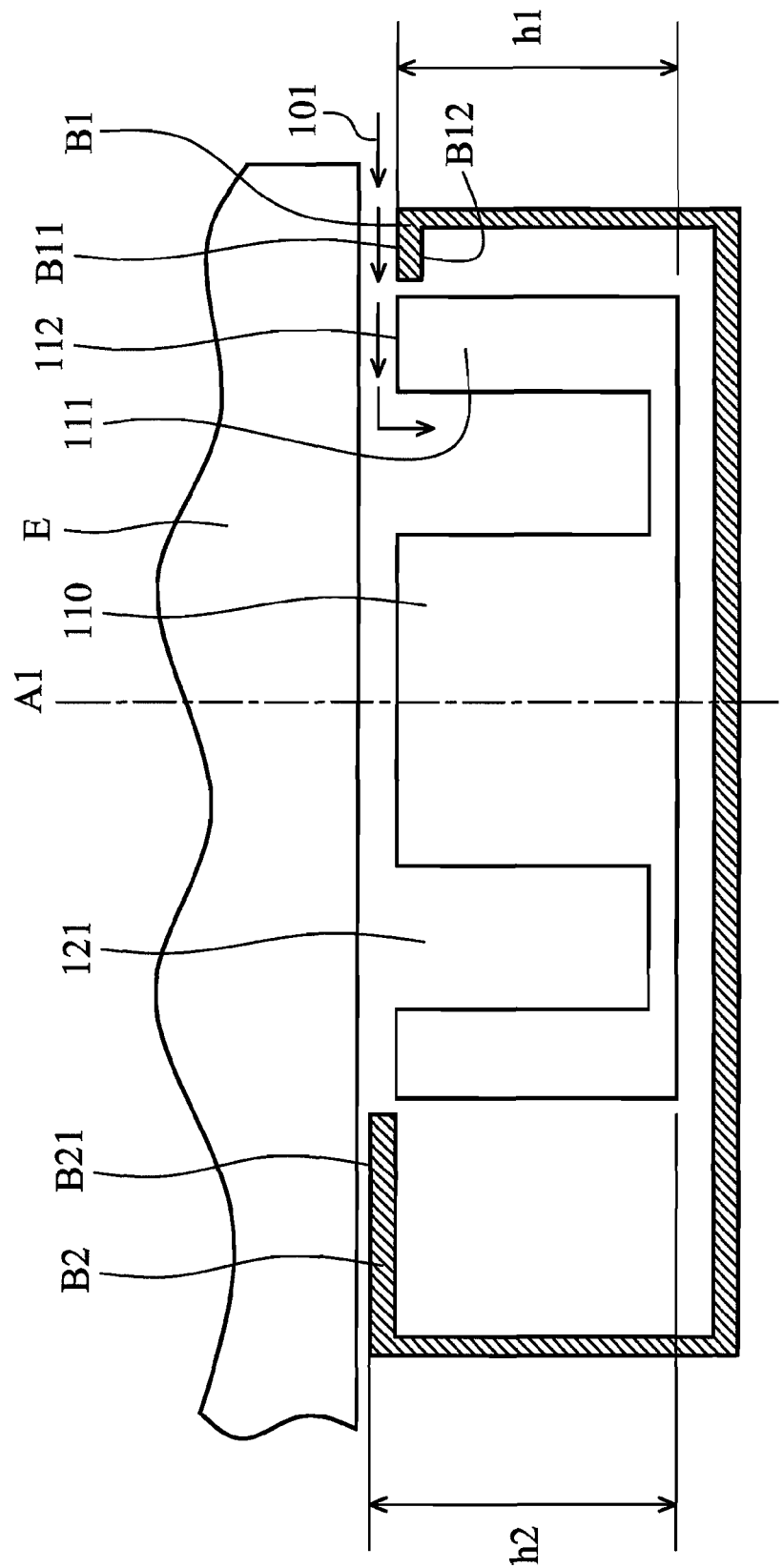
FIG. 2 is a sectional view along direction II-II' of FIG. 1B.

FIG. 2 is a sectional view along direction II-II' of FIG. 1B. The first outer surface B11 relative to the impeller 110 has a first outer surface height h1 corresponding to the impeller axial direction A1, and the second outer surface B21 relative to the impeller 110 has a second outer surface height h2 corresponding to the impeller axial direction A1, and the second outer surface height h2 is higher than the first outer surface height h1. The impeller 110 comprises a plurality of blades 111, wherein each blade 111 has a top portion 112, and the first peripheral structure B1 has a first inner surface B12. A height position of the top portion 112 corresponding to the impeller axial direction A1 is between the first outer surface B11 and the first inner surface B12. In a modified example, a height position of the top portion 112 corresponding to the impeller axial direction A1 is the same as that of the first outer surface B11 (as shown in FIG. 2).

A step portion B4 is formed between the first peripheral structure B1 and the second peripheral structure B2, and the step portion B4 comprises an inclined surface B3.

Figure 1C:
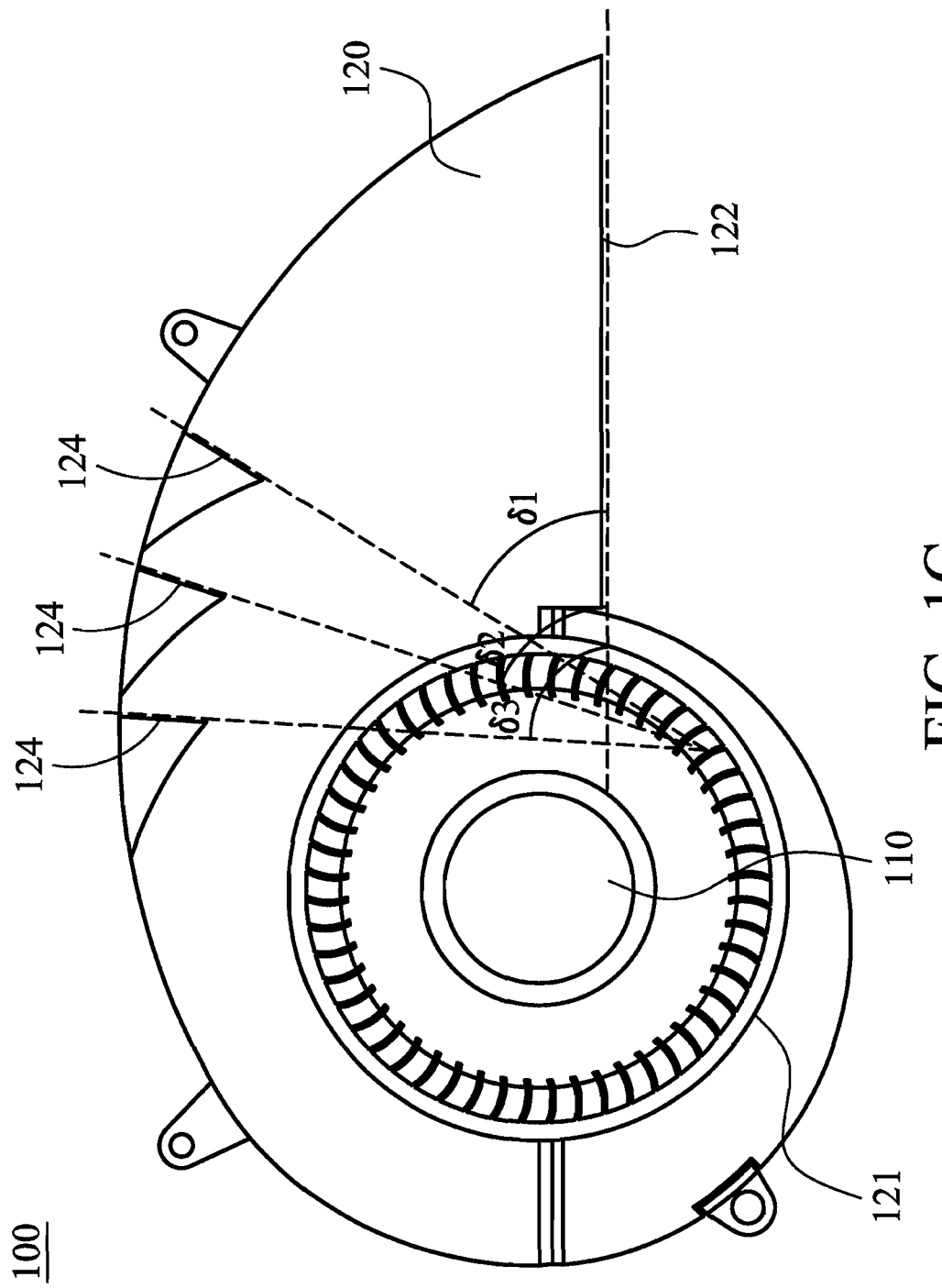
FIG. 1C shows the centrifugal fan of a modified embodiment of the invention.

With reference to FIGS. 1A and 1B, the flow path comprises a high pressure area H and a low pressure area L, wherein the high pressure area H has a relatively narrower path width, and the low pressure area L has a relatively wider path width, and at least a portion of the first peripheral structure B1 is located in the high pressure area H, and at least a portion of the second peripheral structure B2 is located in the low pressure area L. The auxiliary inlets 124 are located in the low pressure area L. In FIG. 1, the low pressure area L is in a location where the included angle θ is about between 0° to 135°.

With reference to FIG. 2, by utilizing the centrifugal fan 100 of the embodiment of the invention, even though the inlet 121 of the centrifugal fan 100 is adjacent to the other electronic element E, due to the step difference between the first peripheral structure B1 and the second peripheral structure B2, the major flow 101 is impelled into the inlet 121. The inlet diameter $\psi_i$ is greater than or equal to the impeller diameter $\psi_f$, thus, the impelled flow rate is increased, and heat dissipation effect is improved. At least a portion of the first peripheral structure B1 is located in the high pressure area H to prevent flow leakage. Since the tablet computer and the ultrabook are extremely thin, the dimensions of the centrifugal fan disposed therein need to be decreased, and the height of the blades need to be decreased. However, the working area of the blades would need to be reduced. In the embodiment of the invention, the blades are extended to the outer surface of the peripheral structure around the inlet, thus, the height of the blades is increased, and the working area and heat dissipation effect thereof are improved.

With reference to FIGS. 1A and 1B, an auxiliary flow 102 is guided by the guiding grooves 127, and enters the housing 120 through the auxiliary inlets 124. Each guiding groove 127 comprises an inclined guiding slope 128 and a guiding sheet 125, and the guiding sheet 125 is adjacent to the guiding slope 128 and extended laterally. The guiding slope 128 axially inclines downwardly from the upper plate 120T toward an extension direction of the auxiliary inlet 124, and the guiding sheet 125 is adjacent to the auxiliary inlet 124. In this embodiment, the guiding sheets 125 and the housing 120 are integrally formed.

The auxiliary flow 102 is guided by the guiding sheets 125, entering the housing 120 through the auxiliary inlets 124, and passes through the flow path 126, and then, it is output through the outlet 122. Each guiding sheet 125 curvedly extends from the side wall 123 into the housing toward the outlet 122. Each guiding groove 127 comprises a fringe wall 129, extending axially downward from the upper plate 120T, adjacent to the guiding slope 128 and the guiding sheet 125, and the auxiliary inlet 124 is formed on the fringe wall 129. An included angle is formed between the auxiliary inlet 124 and the side wall 123.

In this embodiment, a side wall 123 is an involute wall, a center of a base circle of the involute wall is on an axle of the impeller 110, the involute wall 123 has a generating line extending on a tangent line of the base circle of the involute wall, and the auxiliary inlets 124 are substantially located on the involute wall 123 where the generating line has the greatest length. In the centrifugal fan of the embodiment of the invention, the auxiliary inlets 124 are formed in the low pressure area L, the auxiliary flow 102 is sufficiently impelled, eddy flow is prevented, flow rate is increased, and uniformity of the output flow is improved. Even in an electronic device with limited inner space, the centrifugal fan of the embodiment of the invention provides improved heat dissipation effect.

In the embodiment of the invention, the impeller 110 can be wave-blade impeller, wheel-blade impeller or other impellers.

In the embodiment of the invention, the inlet 121 is an axial inlet, and the auxiliary inlets 124 are lateral inlets. The air entering directions of the auxiliary inlets 124 are substantially perpendicular to an air entering direction of the inlet 121.

Included angles are formed between extension directions of the auxiliary inlets 124 and an extension direction of the outlet 122, and the included angles are between 45° and 100°. In one embodiment, with reference to FIG. 1C, the included angle between the extension direction of the auxiliary inlet 124 closer to the outlet 122 to the extension direction of the outlet 122 decreases, and the included angle between the extension direction of the auxiliary inlet 124 farther away from the outlet 122 and the extension direction of the outlet 122 increases ($\delta1<\delta2<\delta3$). In another embodiment, all the included angles between the extension directions of the auxiliary inlets 124 and the extension direction of the outlet 122 are the same. In further another embodiment, the extension directions of the auxiliary inlets 124 are substantially perpendicular to the extension direction of the outlet 122.

Figure 3:
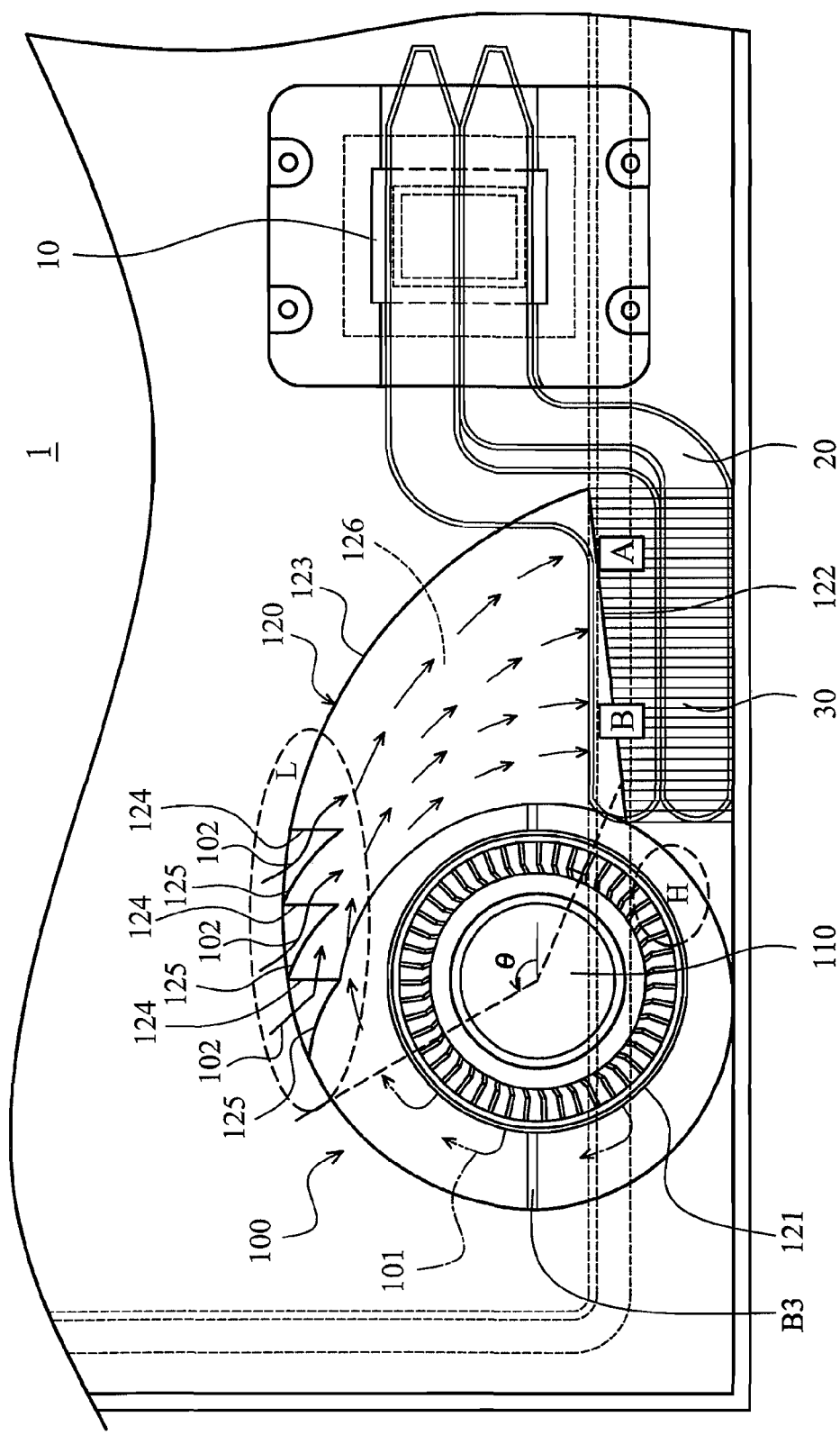
FIG. 3 shows an electronic device of an embodiment of the invention.

FIG. 3 shows an electronic device 1 of an embodiment of the invention, comprising a heat source 10, a heat conducting element 20, a heat sink 30 and the centrifugal fan 100. The heat conducting element 20 is connected to the heat source 10. The heat sink 30 is connected to the heat conducting element 20. The centrifugal fan 100 comprises the impeller 110 and the housing 120. When the electronic device 1 operates, the heat on the heat source 10 is transmitted to the heat sink 30 via the heat conducting element 20. The major flow 101 is impelled by the impeller 110, entering the housing 120 through the inlet 121, and passing through the flow path 126, and then, it is output through the outlet 122 to remove the heat from the heat sink 30. The auxiliary flow 102 is guided by the guiding sheets 125, entering the housing 120 through the auxiliary inlets 124, passing through the flow path 126, and then, it is output through the outlet 122 toward the heat sink 30 to increase flow rate and to improve heat dissipation.

In the embodiment above, the heat sink 30 and the centrifugal fan 100 can be defined as a heat dissipation module.

In the embodiment above, the heat source 10 can be a chip. The heat conducting element 20 can be a heat pipe. The heat sink 30 can comprise a plurality of fins.

As shown in FIG. 3, in the embodiment of the invention, the auxiliary inlets 124 are formed in the low pressure area, and the auxiliary flow is sufficiently impelled, and uniformity of the output flow is improved. In the conventional centrifugal fan, the major portion of the output flow passes through area A, and only a small portion of the output flow passes through area B, thus, the output flow is non-uniform, and only the heat on the portion in area A of the heat sink 30 can be dissipated. Utilizing the auxiliary inlet 124 of the embodiment of the invention, the output flow can uniformly pass through area A and area B, and heat dissipation is improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A centrifugal fan, comprising:
an impeller, having an impeller diameter; and
a housing, comprising an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet, wherein a greatest width of the inlet is greater than or equal to the impeller diameter,
wherein the housing further comprises a guiding groove, at least one auxiliary inlet is formed in the guiding groove, the guiding groove guides an auxiliary flow, and auxiliary flow enters the housing through the auxiliary inlet, wherein the inlet is an axial inlet, and the auxiliary inlet is a lateral inlet,
wherein the guiding groove comprises an inclined guiding slope, and the guiding slope is inclined toward an extension direction of the auxiliary inlet from a surface of the housing,
wherein the guiding groove comprises a guiding sheet adjacent to the guiding slope and extended laterally, the guiding slope axially inclines downwardly from the upper plate toward an extension direction of the auxiliary inlet, and the guiding sheet curvedly extends from the side wall into the housing toward the outlet.

2. The centrifugal fan as claimed in claim 1, wherein the inlet is circular, the inlet has an inlet diameter, and the inlet diameter is greater than or equal to the impeller diameter.

3. The centrifugal fan as claimed in claim 1, wherein the housing has a first peripheral structure and a second peripheral structure, and the first peripheral structure and the second peripheral structure surround the inlet, and the second peripheral structure is higher than the first peripheral structure.

4. The centrifugal fan as claimed in claim 3, wherein the first peripheral structure has a first outer surface, the second peripheral structure has a second outer surface, the first outer surface relative to the impeller has a first outer surface height corresponding to an impeller axial direction, the second outer surface relative to the impeller has a second outer surface height corresponding to the impeller axial direction, and the second outer surface height is higher than the first outer surface height.

5. The centrifugal fan as claimed in claim 4, wherein the impeller comprises a plurality of blades, each blade has a top portion, the first peripheral structure has a first inner surface, and a height position of the top portion corresponding to the impeller axial direction is between the first outer surface and the first inner surface.

6. The centrifugal fan as claimed in claim 4, wherein the impeller comprises a plurality of blades, each blade has a top portion, the first peripheral structure has a first inner surface, and a height position of the top portion corresponding to the impeller axial direction is the same as that of the first outer surface.

7. The centrifugal fan as claimed in claim 3, wherein a step portion is formed between the first peripheral structure and the second peripheral structure.

8. The centrifugal fan as claimed in claim 7, wherein the step portion comprises an inclined surface.

9. The centrifugal fan as claimed in claim 3, wherein the flow path comprises a high pressure area and a low pressure area, and the high pressure area has a relatively narrower path width, and the low pressure area has a relatively wider path width, at least a portion of the first peripheral structure is located in the high pressure area, and at least a portion of the second peripheral structure is located in the low pressure area.

10. The centrifugal fan as claimed in claim 1, wherein the guiding groove comprises a fringe wall, extending axially downward from the upper plate, adjacent to the guiding slope and the guiding sheet, and auxiliary inlet is formed on the fringe wall.

11. The centrifugal fan as claimed in claim 1, wherein an air entering direction of the auxiliary inlet is substantially perpendicular to an air entering direction of the inlet.

12. The centrifugal fan as claimed in claim 1, wherein a first included angle is formed between a first extension direction of a first auxiliary inlet and an extension direction of the outlet, and a second included angle is formed between a second extension direction of a second auxiliary inlet and the extension direction of the outlet, and the first auxiliary inlet is closer to the outlet relative to the second auxiliary inlet, and the first included angle is smaller than the second included angle.

13. The centrifugal fan as claimed in claim 1, wherein a first included angle is formed between a first extension direction of a first auxiliary inlet and an extension direction of the outlet, and a second included angle is formed between a second extension direction of a second auxiliary inlet and the extension direction of the outlet, and the first included angle is the same as the second included angle, and the first and second extension directions are substantially perpendicular to the extension direction of the outlet.

14. The centrifugal fan as claimed in claim 1, wherein the side wall is an involute wall, a center of a base circle of the involute wall is on an axle of the impeller, the involute wall has a generating line, and auxiliary inlet is substantially located on the involute wall where the generating line has the greatest length.

15. The centrifugal fan as claimed in claim 1, wherein the flow path comprises a high pressure area and a low pressure area, and the high pressure area has a relatively narrower path width, and the low pressure area has a relatively wider path width, and auxiliary inlet is located in the low pressure area.

16. The centrifugal fan as claimed in claim 1, wherein an included angle is formed between the auxiliary inlet and a surface of the side wall.

17. A centrifugal fan, comprising:
an impeller, having an impeller diameter; and
a housing, comprising an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet, wherein a greatest width of the inlet is greater than or equal to the impeller diameter,
wherein the housing further comprises a guiding groove, at least one auxiliary inlet is formed in the guiding groove, the guiding groove guides an auxiliary flow, and auxiliary flow enters the housing through the auxiliary inlet, wherein the inlet is an axial inlet, and the auxiliary inlet is a lateral inlet, wherein an included angle is formed between an extension direction of the auxiliary inlet and an extension direction of the outlet, and the included angle is between 45° and 100°.

* * * * *